(12) United States Patent
Yamazaki

(10) Patent No.: US 9,961,282 B2
(45) Date of Patent: May 1, 2018

(54) IMAGE PICKUP APPARATUS AND IMAGE PICKUP SYSTEM

(71) Applicant: CANON KABUSHIKI KAISHA, Tokyo (JP)

(72) Inventor: Kazuo Yamazaki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/433,478

(22) Filed: Feb. 15, 2017

(65) Prior Publication Data

US 2017/0244915 A1 Aug. 24, 2017

(30) Foreign Application Priority Data

Feb. 19, 2016 (JP) ................. 2016-030333

(51) Int. Cl.
*H04N 5/357* (2011.01)
*H04N 5/378* (2011.01)
*H01L 27/146* (2006.01)

(52) U.S. Cl.
CPC ....... *H04N 5/357* (2013.01); *H01L 27/14605* (2013.01); *H01L 27/14621* (2013.01); *H01L 27/14623* (2013.01); *H01L 27/14627* (2013.01); *H04N 5/378* (2013.01)

(58) Field of Classification Search
CPC .. H04N 5/357; H04N 5/378; H01L 27/14623; H01L 27/14627; H01L 27/14621; H01L 27/14605
USPC ......................................................... 348/241
See application file for complete search history.

(56) References Cited

U.S. PATENT DOCUMENTS

| 7,868,935 | B2 * | 1/2011 | Egawa | H04N 5/361 348/243 |
|---|---|---|---|---|
| 8,325,260 | B2 * | 12/2012 | Yamazaki | H04N 5/3742 348/241 |
| 9,318,534 | B2 * | 4/2016 | Joei | H01L 27/14634 |
| 9,549,139 | B2 * | 1/2017 | Ikeda | H04N 5/347 |
| 9,786,579 | B2 * | 10/2017 | Ishii | H01L 23/48 |
| 9,813,646 | B2 * | 11/2017 | Takado | H04N 5/378 |
| 2006/0114342 | A1 * | 6/2006 | Egawa | H04N 5/361 348/241 |
| 2006/0125945 | A1 * | 6/2006 | Suzuki | H01L 27/14625 348/311 |
| 2008/0297636 | A1 * | 12/2008 | Mizuguchi | H04N 5/347 348/294 |
| 2009/0185060 | A1 * | 7/2009 | Akiyama | H01L 27/14623 348/294 |
| 2012/0199927 | A1 * | 8/2012 | Shimotsusa | H01L 27/14623 257/432 |
| 2012/0326257 | A1 * | 12/2012 | Takata | H01L 27/307 257/432 |

(Continued)

FOREIGN PATENT DOCUMENTS

JP 2015-46761 A 3/2015

*Primary Examiner* — Pritham Prabhakher
(74) *Attorney, Agent, or Firm* — Canon U.S.A., Inc. IP Division

(57) ABSTRACT

For each of the signal corresponding to a signal of a photoelectric converting unit being only a part of an effective pixel and the signal corresponding to a signal obtained by adding signals of a plurality of photoelectric converting units, the difference corresponding to the signal corresponding to the signal obtained by adding the signals of the plurality of photoelectric converting units of a light-shielded pixel.

20 Claims, 5 Drawing Sheets

(56) References Cited

U.S. PATENT DOCUMENTS

2015/0062394 A1* 3/2015 Ikeda .................... H04N 5/347
                                                            348/301
2015/0194465 A1* 7/2015 Lin ................... H01L 27/14636
                                                            438/98
2015/0194469 A1* 7/2015 Joei ....................... H01L 27/307
                                                            257/40

* cited by examiner

IMAGE PICKUP APPARATUS AND IMAGE PICKUP SYSTEM

BACKGROUND OF THE INVENTION

Field of the Invention

One disclosed aspect of the embodiments relates to an image pickup apparatus and an image pickup system.

Description of the Related Art

An image pickup apparatus having a plurality of pixels which are provided with photoelectric converting units is known. In some cases, the plurality of pixels include light-shielded pixels in which the photoelectric converting units are shielded from light and effective pixels in which incident light enters the photoelectric converting units. The signal output from the light-shielded pixel is subtracted from the signal output from the effective pixel. As a result, the noise component included in common in the signal output from the effective pixel and the signal output from the light-shielded pixel can be subtracted from the signal output from the effective pixel.

Also, like an image pickup apparatus described in Japanese Patent Laid-Open No. 2015-46761, there is known an image pickup apparatus which has a plurality of pixels including a plurality of photoelectric converting units disposed below the same microlens and outputs a signal based on the electric charge of one of the photoelectric converting units and a signal based on the sum of the electric charges of the plurality of photoelectric converting units.

Japanese Patent Laid-Open No. 2015-46761 describes the configuration in which the light-shielded pixels are provided in an OB region, and the effective pixels are provided in an opening region. In the OB region, an (A+B)+(A+B) signal which is a signal obtained by adding the signals based on the electric charges of the plurality of photoelectric converting units among the plurality of light-shielded pixels is output. In the opening region, an A+A signal and an (A+B)+(A+B) signal which are the signals obtained by adding the signal which is based on the electric charge of part of the photoelectric converting units and the signal based on the sum of the electric charges of the plurality of photoelectric converting units among the plurality of effective pixels is output.

SUMMARY OF THE INVENTION

One feature of the embodiments is accomplished in view of the above described problems. An aspect is an image pickup apparatus including a plurality of pixels and a signal processing unit. The plurality of pixels is arranged in a plurality of rows, and each has one microlens and a plurality of photoelectric converting units. The plurality of photoelectric converting units is disposed to correspond to each one of the microlenses. The plurality of pixels outputs a signal by a row unit. A pixel of a row being a part of the plurality of rows is a light-shielded pixel having the plurality of photoelectric converting units shielded from light. A pixel of a row being other part of the plurality of rows is an effective pixel having the plurality of photoelectric converting units to which the light transmitted through the one microlens enters. The effective pixel outputs a first signal based on a signal generated by the photoelectric converting unit being only a part of the plurality of photoelectric converting units and outputs a second signal based on a signal obtained by adding signals generated by the plurality of photoelectric converting units. The light-shielded pixel outputs a third signal based on a signal obtained by adding signals generated by the plurality of photoelectric converting units. The signal processing unit is configured to obtain a first difference between a signal based on the first signal and a signal based on the third signal and obtain a second difference between a signal based on the second signal and the signal based on the third signal.

Further features of the embodiments will become apparent from the following description of exemplary embodiments (with reference to the attached drawings).

DESCRIPTION OF THE EMBODIMENTS

Japanese Patent Laid-Open No. 2015-46761 does not include sufficient study of the output operation of the signal of the light-shielded pixel in the case in which the effective pixel outputs the signal based on the electric charge of one of the photoelectric converting units and the signal based on the sum of the electric charges of the plurality of photoelectric converting units.

The techniques described below are related to those for obtaining the difference between the signal based on the pixel signal of an effective pixel and the signal based on the pixel signal of a light-shielded pixel in a configuration in which the effective pixel and the light-shielded pixel both include a plurality of photoelectric converting units disposed below a single microlens.

Hereinafter, embodiments will be described with reference to drawings.

First Embodiment

Figure 1:
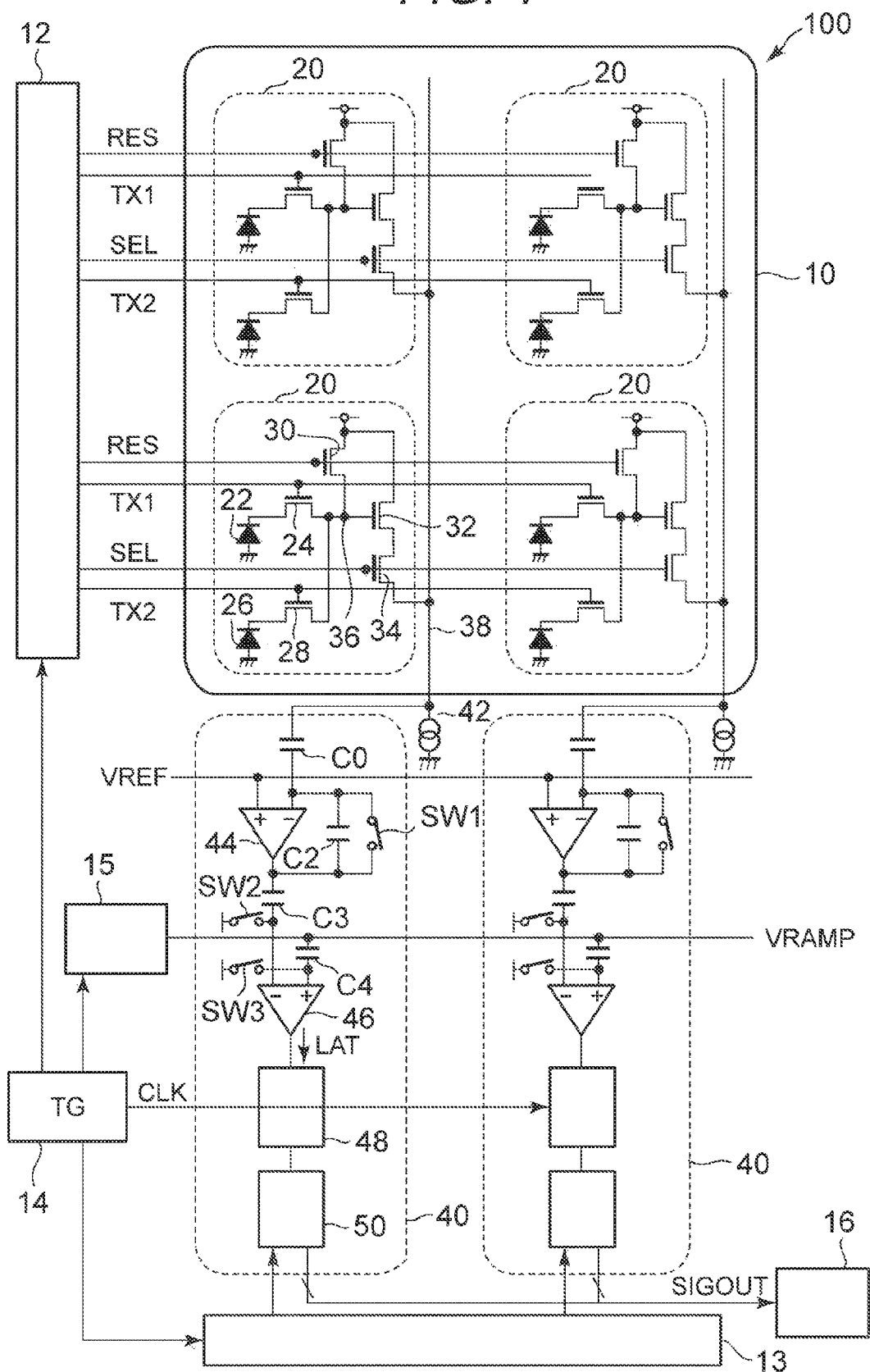
FIG. 1 is a diagram showing an example of a configuration of an image pickup apparatus.

First, an outline of a configuration of an image pickup apparatus of the present embodiment will be described by using FIG. 1. FIG. 1 is a circuit diagram schematically showing the configuration of the image pickup apparatus.

The image pickup apparatus 100 has a pixel array 10, a column circuit 40, a vertical scanning circuit 12, a horizontal scanning circuit 13, a timing generator (TG) 14, and a ramp-signal supplying circuit 15. Furthermore, the image pickup apparatus of the present embodiment has a digital-signal processing circuit 16, which is a signal processing unit.

The pixel array 10 has a plurality of effective pixels 20 disposed across a plurality of rows and a plurality of columns. FIG. 1 shows the effective pixels 20 disposed across two rows and two columns as an example of the pixel array 10.

Each of the effective pixels 20 has a plurality of photoelectric converting units and a plurality of transfer transistors. The effective pixel 20 has a photodiode 22 which is one of the photoelectric converting units, a photodiode 26 which is one of the photoelectric converting units, a transfer transistor 24, and a transfer transistor 28. Furthermore, the effective pixel 20 has a reset transistor 30, an amplifying transistor 32, and a selection transistor 34. A node 36 is connected to main nodes of the transfer transistor 24, the transfer transistor 28, and the reset transistor 30 and to a gate of the amplifying transistor 32. A power source voltage is supplied to the main nodes of the amplifying transistor 32 and the reset transistor 30.

In FIG. 1, a signal line TX1, a signal line TX2, a signal line RES, and a signal line SEL are respectively disposed in the rows of the effective pixel 20. The signal line TX1 is connected to gates of the respective transfer transistors 24 of the plurality of effective pixels 20 disposed in the same row. The signal line TX2 is connected to gates the respective transfer transistors 28 of the plurality of effective pixels 20 disposed in the same row. The signal line RES is connected to gates of the reset transistors 30 of the plurality of effective pixels 20 disposed in the same row. The signal line SEL is connected to the respective selection transistors 34 of the plurality of effective pixels 20 disposed in the same row.

Each of the signal lines TX1, TX2, RES, and SEL is disposed as a single signal line for each effective pixel 20 which is disposed in one row.

The vertical scanning circuit 12 selects the pixel 20 by the row thereof based on a timing signal from TG 14 and causes the pixel 20 to output a signal. The signal lines TX, RES, and SEL are connected to the vertical scanning circuit 12.

A signal PTX1, which is a control signal for driving the transfer transistor 24, is supplied from the vertical scanning circuit 12 to the signal line TX1.

A signal PTX2, which is a control signal for driving the transfer transistor 28, is supplied from the vertical scanning circuit 12 to the signal line TX2.

A signal PRES, which is a control signal for driving the reset transistor 30, is supplied from the vertical scanning circuit 12 to the signal line RES.

A signal PSEL, which is a control signal for driving the selection transistor 34, is supplied from the vertical scanning circuit 12 to the signal line SEL.

Vertical signal lines 38 are disposed respectively in the columns of the pixel array 10. The single vertical signal line 38 is connected to main nodes of the respective selection transistors 34 of the effective pixels 20 of a plurality of rows disposed in one column. The single vertical signal line 38 is a signal line connected in common to the effective pixels 20 of a plurality of rows disposed on one column. The column circuit 40 and a current source 42 are connected to the vertical signal line 38 of each column. The current source 42 may be, for example, a current source capable of switching a current value or may be a constant current source. The current source 42 constitutes a source follower circuit with the amplifying transistor 32 and the power source voltage supplied to the main node of the amplifying transistor 32.

The column circuit 40 is for processing the signals output from the pixel array 10. The column circuit 40 has a capacitive element C0, a capacitive element C3, a capacitive element C4, a capacitive element C2 which is a feedback capacity, switches SW1 to SW3, and an operational amplifier 44. Furthermore, the column circuit 40 has a comparison circuit 46, a counter circuit 48, and a memory unit 50. An inverting input terminal of the operational amplifier 44 is connected to the vertical signal line 38 via the capacitive element C0. A reference voltage Vref is given to a non-inverting input terminal of the operational amplifier 44. Between the inverting input terminal and an output terminal of the operational amplifier 44, the capacitive element C2 and the switch SW1 are connected in parallel. The output terminal of the operational amplifier 44 is connected to one of input terminals of the comparison circuit 46 via the capacitive element C3. The switch SW2 is connected between a connection node of the capacitive element C3 and the comparison circuit 46 and a fixed voltage line (for example, a power-source-voltage line). The ramp-signal supplying circuit 15 is connected to the other input terminal of the comparison circuit 46 via the capacitive element C4. The ramp-signal supplying circuit 15 is a circuit for supplying a signal VRAMP, which is a ramp signal used in processing of signals in the column circuit 40, based on a control signal supplied from TG 14. The switch SW3 is connected between a connection node of the capacitive element C4 and the comparison circuit 46 and a fixed voltage line (for example, a power-source-voltage line). Control signals for switching ON or OFF of the switches are supplied by signal lines (not shown) to the switches SW1 to SW3 from TG 14. A counter circuit 48 is connected to an output terminal of the comparison circuit 46. TG 14 and the memory unit 50 are connected to the counter circuit 48.

The horizontal scanning circuit 13 is connected to the memory unit 50 of each column. The memory unit 50 of each column is connected to the digital-signal processing circuit 16 via a signal line SIGOUT.

Each of the plurality of effective pixels 20 shown in FIG. 1 outputs an A+B signal, which is a signal based on the electric charge obtained by adding the electric charges respectively generated by the photodiode 22 and the photodiode 26. The effective pixel(s) 20 of only part of the plurality of effective pixels 20 shown in FIG. 1 further outputs an A signal, which is a signal based on the electric charge generated by only part of the photodiode 22 and the photodiode 26.

Figure 2:
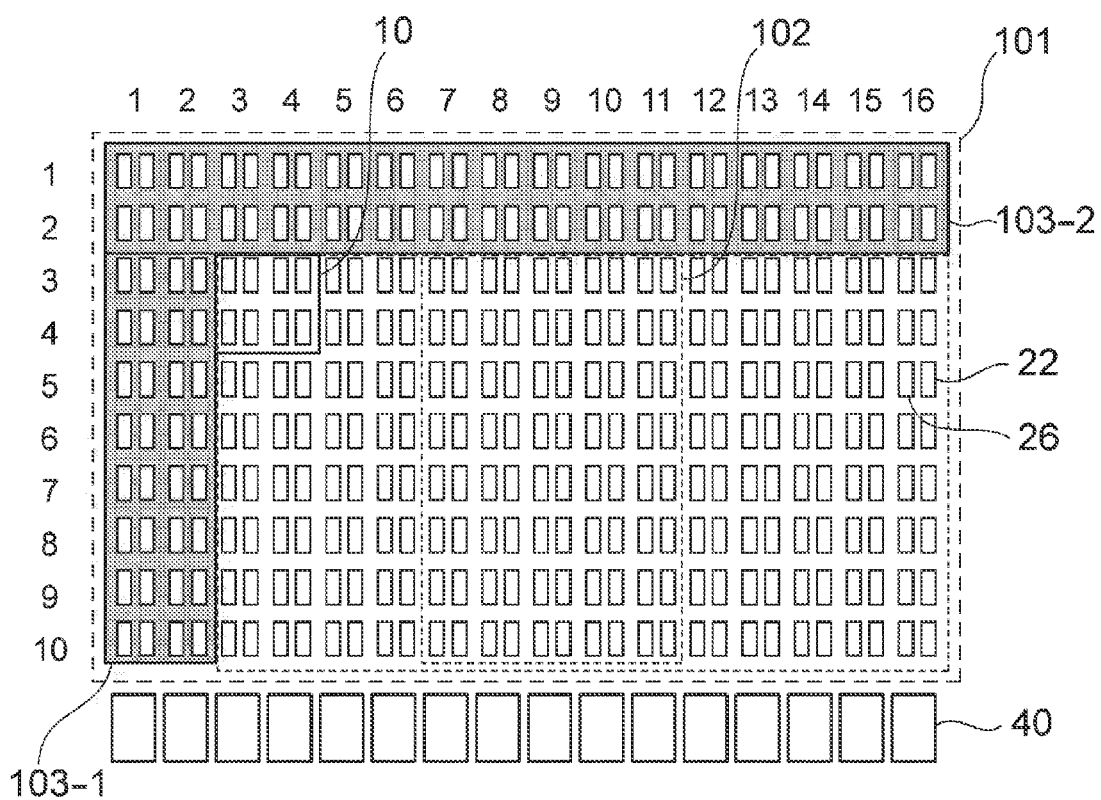
FIG. 2 is a diagram showing an arrangement of pixel regions and column circuits of the image pickup apparatus.

FIG. 2 is a view showing a pixel region of the image pickup apparatus of the present embodiment and the column circuits 40. The pixel array 10 shown in FIG. 1 corresponds to the pixel array 10 shown in FIG. 2. The image pickup apparatus of the present embodiment has a pixel region 101, an effective pixel region 110, a horizontal light-shielded region 103-1, and a vertical light-shielded region 103-2. The horizontal light-shielded region 103-1 has the light-shielded pixels of a 3rd row to a 10th row and a 1st column to a 2nd column. The vertical light-shielded region 103-2 has the light-shielded pixels of the 1st row to the 2nd row and the 1st column to a 16th column. The configurations of the light-shielded pixels are the same as the configurations of the effective pixels 20 except that light is shielded so that light does not enter the photodiodes 22, 26 of the effective pixels 20 shown in FIG. 1.

For a focal-point detection region 102, the digital-signal processing circuit 16 of the present embodiment outputs signals respectively based on the A signals and A+B signals of the effective pixels 20.

For the regions not included in the focal-point detection region 102 in the pixel region 101, signals respectively based on the A+B signals of the effective pixels 20, the A+B signals of the light-shielded pixels of the horizontal light-shielded region 103-1, and the A signals and the A+B signals of the light-shielded pixels of the vertical light-shielded region 103-2 are output.

Figure 3A:
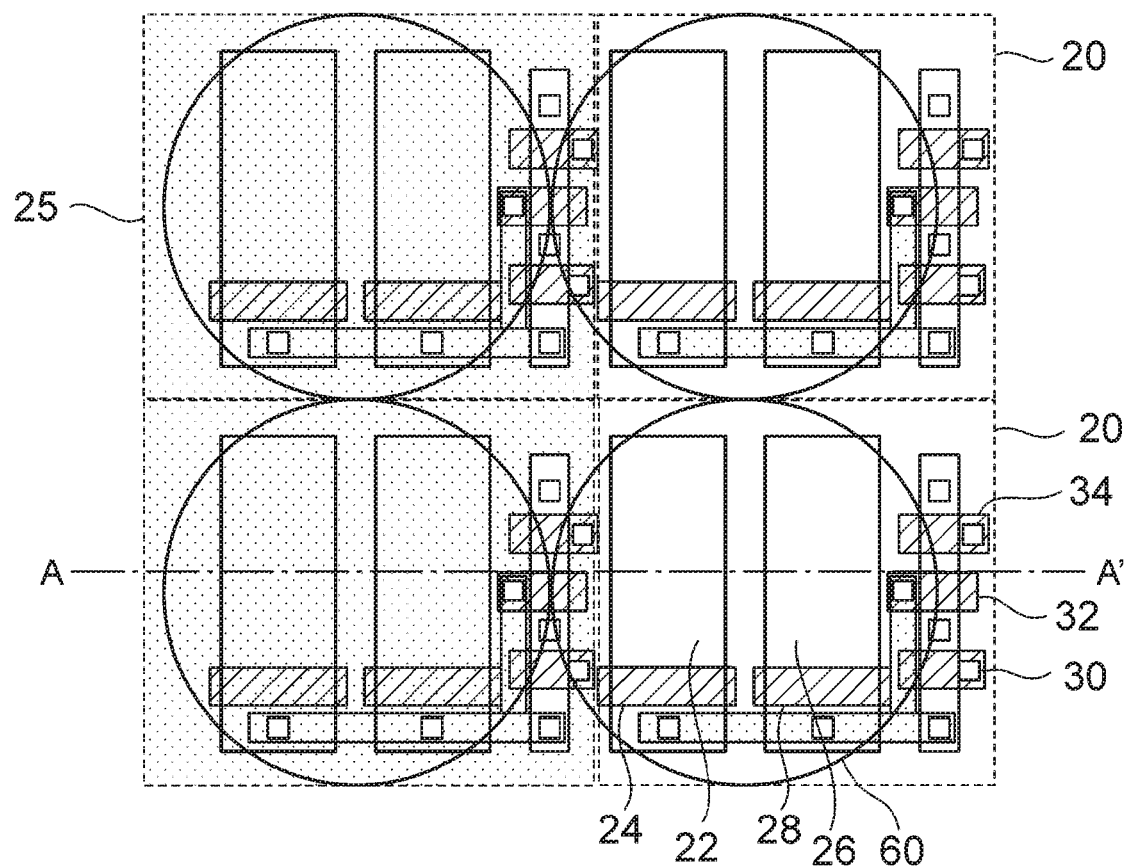
FIGS. 3A and 3B are an overhead view showing a configuration of pixels and a cross-sectional view showing the configuration of the pixels.
Figure 3B:
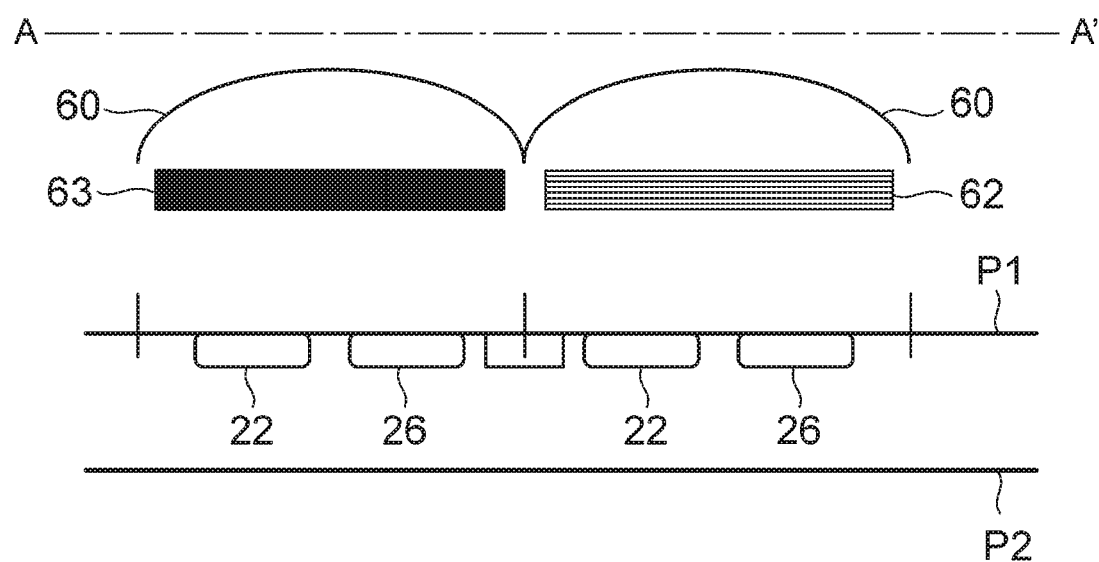

FIGS. 3A and 3B are views showing the effective pixels 20 and light-shielded pixels 25, which are disposed in the horizontal light-shielded region 103-1 shown in FIG. 2. The reference signs denoting elements of FIG. 3A correspond to the reference signs shown in FIG. 1. A view showing the cross section of a line A-A' shown in FIG. 3A is FIG. 3B. As shown in FIG. 3B, the light-shielded pixel 25 has a single microlens 60 and a light-shielding film 63. The photodiode 22 and the photodiode 26 of the light-shielded pixel 25 are shielded from light by the light-shielding film 63. The effective pixel 20 has a single microlens 60 and a color filter 62. The light which has transmitted through the microlens 60 and the color filter 62 enters the photodiode 22 and the photodiode 26 of the effective pixel 20.

Figure 4:
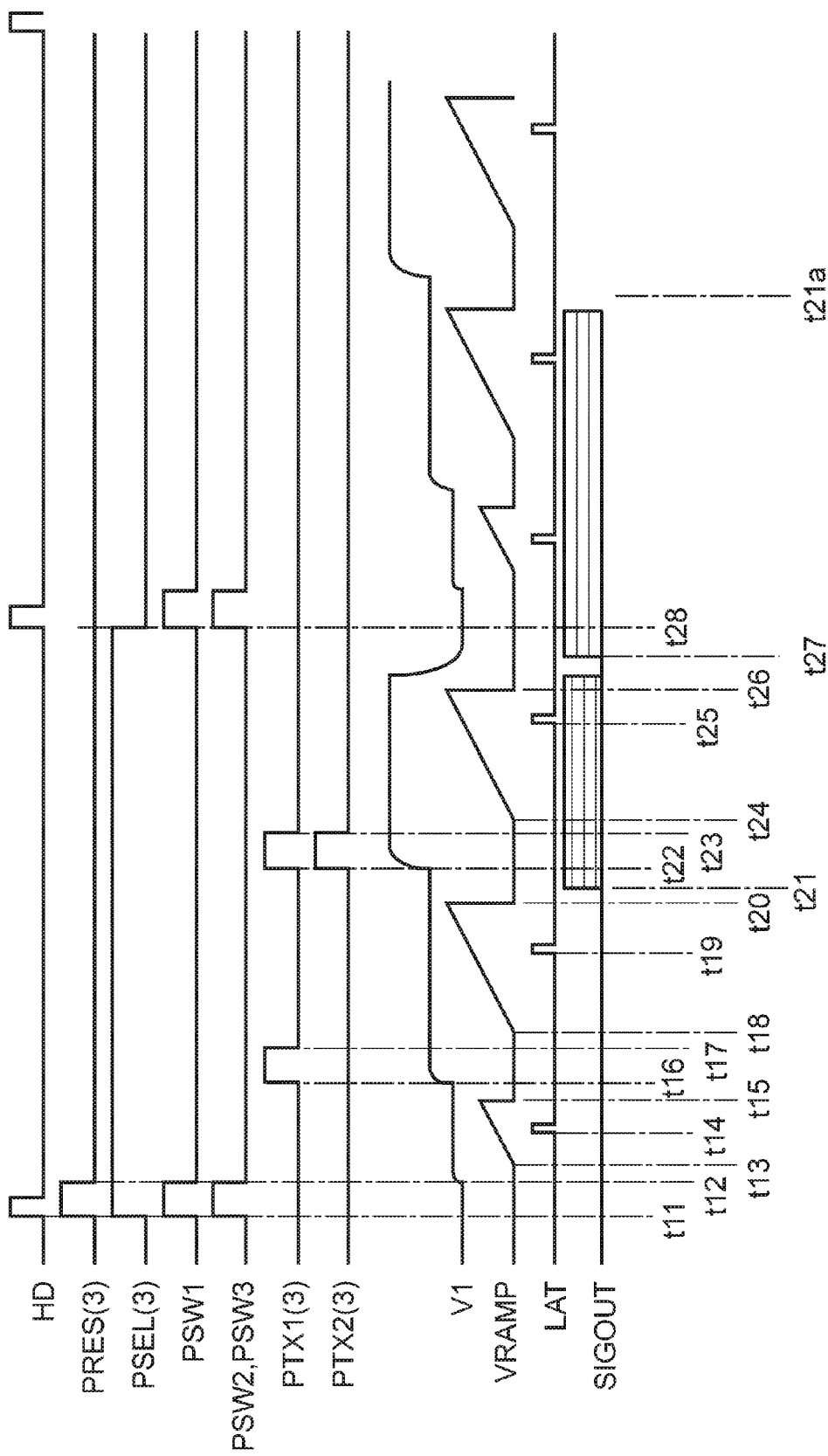
FIG. 4 is a diagram showing an example of operations of the image pickup apparatus.

FIG. 4 is a timing chart showing operations of the image pickup apparatus of the present embodiment.

In the following description, it is assumed that the transfer transistor 24, the transfer transistor 28, the reset transistor 30, the selection transistor 34, and the switches SW1 to SW3 operate in the following manner in accordance with supplied control signals. If a signal of a High level (hereinafter, H level) is applied as the control signal, the transistor or the switch becomes a conducting (on) state. If a signal of a Low level (hereinafter, L level) is applied as the control signal, the transistor or the switch becomes a non-conducting (off) state.

FIG. 4 shows a signal HD, the signal PRES, the signal PSEL, signals PSW1 to PSW3, the signal PTX1, the signal PTX2, a signal V1, the signal VRAMP, a signal LAT, and a signal VSIGOUT. The signal PRES, the signal PSEL, the signal PTX1, and the signal PTX2 are the control signals respectively supplied to the signal lines RES, SEL, TX1, and TX2 of FIG. 1. The signals PSW1 to PSW3 are the control signals respectively supplied to the switches SW1 to SW3 of FIG. 1. The signal V1 is the output signal of the operational amplifier 44. The signal VRAMP is a ramp signal output from the ramp-signal supplying circuit 15. The signal LAT is a latch signal output from the comparison circuit 46. The signal VSIGOUT is a signal output from the signal line SIGOUT.

In FIG. 4, the signals are respectively denoted by the numbers corresponding to row numbers. The signals supplied to the pixel of an N-th row are PRES (N), PSEL (N), PTX1 (N), and PTX2 (N). In FIG. 4, as an example of the operations, PRES (3), PSEL (3), PTX1 (3), and PTX2 (3), which are the signals supplied to the pixel of the third row, are shown. The signal V1 represents the output signal of the operational amplifier 44 of the column circuit 40 to which the signal output from the effective pixel 20 is input. The signals and operations of the column circuit 40 to which the signal output from the light-shielded pixel 25 is input will be appropriately described by words.

First, at time t11, the vertical scanning circuit 12 supplies a signal PRES (1) of an H level, thereby turning on the reset transistor 30 of the effective pixel 20. As a result, the node 36 is reset to the voltage of a reset level. At time t11, the vertical scanning circuit 12 supplies a signal PSEL (1) of the H level, thereby turning on the selection transistor 34. As a result, a current is supplied from the current source 42 to the amplifying transistor 32 via the vertical signal line 38 and the selection transistor 34. As a result, the amplifying transistor 32 operates as part of the source follower circuit. Then, the signal of the case in which the node 36 is at the electric potential of the reset level is output to the vertical signal line 38 via the selection transistor 34.

At time t11, TG 14 changes the signals PSW1 to PSW3 to the H level. As a result, the switches SW1 to SW3 are turned on. When the switch SW1 is turned on, the output terminal and the input terminal of the operational amplifier 44 become a short-circuited state, and the operational amplifier 44 is reset. When the switch SW2 and the switch SW3 are turned on, the capacitive element C3 and the capacitive element C4 are reset, respectively.

At time t12, the vertical scanning circuit 12 changes the signal PRES (1) to an L level. As a result, the reset transistor 30 is turned off. When the signal PRES (1) is changed from the H level to the L level, the electric potential of the node 36 is changed by the charge injection which occurs at the reset transistor 30. As a result, the signal level of the signal output to the vertical signal line 38 is changed. The signal output from the pixel at this point is described as an N signal. The N signal output from the effective pixel 20 is an effective N signal, and the N signal output from the light-shielded pixel 25 is a light-shielded N signal.

Similarly, at the time t12, TG 14 changes the signals PSW1 to PSW3 to the L level. As a result, the capacitive element C0 clamps the effective N signal. The capacitive element C3 clamps an offset signal output from the operational amplifier 44. This offset signal is described as an Off signal.

From time t13, the ramp-signal supplying circuit 15 monotonically increases the voltage of the signal VRAMP along with elapse of time. The ramp-signal supplying circuit 15 supplies the signal VRAMP to the comparison circuit 46 via the capacitive element C4.

The comparison circuit 46 starts a comparing operation of the signal input from the operational amplifier 44 via the capacitive element C3 and the signal VRAMP supplied from the ramp-signal supplying circuit 15 via the capacitive element C4. The comparison circuit 46 outputs the signal LAT, which is a signal based on the comparison result, to the counter circuit 48. Specifically, when the magnitude relation of the two signals subjected to the comparison is reversed, the comparison circuit 46 changes the signal LAT from the L level to the H level.

A signal CLK, which is a clock pulse, is input from TG 14 to the counter circuit 48. At the same time when the ramp-signal supplying circuit 15 starts increasing the voltage value of the signal VRAMP, the counter circuit 48 starts counting the signal CLK.

At time t14, the magnitude relation of the signal input from the operational amplifier 44 via the capacitive element C3 and the signal VRAMP input via the capacitive element C4 is reversed, and the comparison circuit 46 outputs the signal LAT of the H level to the counter circuit 48. The counter circuit 48, which has received the signal LAT of the H level, retains a count signal at this time t14. At time t15, the ramp-signal supplying circuit 15 finishes the monotone change of the electric potential of the signal VRAMP, which is along elapse of time.

Then, the memory unit 50 retains the count signal, which is retained by the counter circuit 48.

The analog signal output from the operational amplifier 44 via the capacitive element C3 by the operations of the comparison circuit 46, the counter circuit 48, and the memory unit 50 carried out at the time t13 to the time t15 is converted (AD conversion) to a digital signal. The obtained digital signal is a signal mainly composed of the component of characteristic variation of each column of the comparison circuit 46. The digital signal is described as a digital N signal. This digital N signal may include at least one of the noise of a case in which the reset transistor 30 is reset, the offset signal Voff of the operational amplifier 44, the offset signal of the comparison circuit 46, etc.

Then, at time t16, the vertical scanning circuit 12 outputs the signal PTX1 of the H level and turns on the transfer transistor 24. As a result, the electric charge generated at the photodiode 22 is transferred to the node 36.

At time t17, the vertical scanning circuit 12 changes the signal PTX1 to the L level. The amplifying transistor 32 outputs the signal based on the electric potential of the node 36, which is corresponding to the amount of the electric charge transferred from the photodiode 22, to the vertical signal line 38 via the selection transistor 34. This signal also includes the component of the N signal of the effective pixel 20. This signal is described as an A+N signal. The A+N signal is a first signal based on the electric charge generated by the photoelectric converting unit which is only part of the plurality of photoelectric converting units.

The signal output to the vertical signal line 38 is input to the inverting input terminal of the operational amplifier 44 via the capacitive element C0 clamping the N signal. The signal input to the inverting input terminal of the operational amplifier 44 is an A signal obtained by subtracting the N signal from the A+N signal.

The gain of the operational amplifier 44 is the value obtained by dividing the capacity value of the capacitive element C0 by the capacity value of the capacitive element C2. The operational amplifier 44 outputs the signal which is obtained by multiplying the A signal by the gain to the capacitive element C3. The signal output from the operational amplifier 44 includes the offset signal of the operational amplifier 44. This signal is described as an amplified A+Off signal.

The amplified A+Off signal output from the operational amplifier 44 is input to the comparison circuit 46 via the capacitive element C3 clamping the Off signal. The signal input to the comparison circuit 46 is an amplified A signal, which is obtained by subtracting the Off signal from the amplified A+Off signal.

At time t18, the ramp-signal supplying circuit 15 monotonically increases the voltage of the signal VRAMP, which is supplied to the comparison circuit 46 via the capacitive element C4, along with elapse of time. The comparison circuit 46 starts a comparing operation of the amplified A signal and the signal VRAMP. As well as the previous AD conversion of the N signal, the counter circuit 48 also starts counting the signal CLK at the same time when the signal level of the signal VRAMP is increased.

At time t19, the magnitude relation of the amplified A signal and the signal VRAMP input via the capacitive element C4 is reversed. As a result, the comparison circuit 46 outputs the signal LAT of the H level to the counter circuit 48. The counter circuit 48, which has received the signal LAT of the H level, retains the count signal. At time t20, the ramp-signal supplying circuit 15 finishes the monotone change of the electric potential of the signal VRAMP which is along elapse of time.

Then, the memory unit 50 retains the count signal retained by the counter circuit 48.

The amplified A signal is subjected to AD conversion by the operations of the comparison circuit 46, the counter circuit 48, and the memory unit 50 from the time t18 to the time t20. The digital signal obtained by subjecting the amplified A signal to the AD conversion is described as a digital A+N signal.

Then, the horizontal scanning circuit 13 causes the memories of the columns corresponding to the light-shielded pixels 25 of the vertical light-shielded region 103-2 shown in FIG. 2 to sequentially output the digital N signals and the digital A+N signals to the digital-signal processing circuit 16. Also, the horizontal scanning circuit 13 causes the memory units 50 of the columns corresponding to the effective pixels 20 of the focal-point detection region 102 shown in FIG. 2 to sequentially output the digital N signals and the digital A+N signals to the digital-signal processing circuit 16. The horizontal scanning circuit 13 does not carry out the process of reading the digital N signals and the digital A+N signals from the memory units 50 corresponding to the effective pixels 20 which are not included in the focal-point detection region 102.

At time t22, the vertical scanning circuit 12 supplies the PTX1 (3) and the signal PTX2 (3) of the H level. As a result, the electric charges generated at the photodiode 22 and the photodiode 26 are transferred to the node 36, which has retained the electric charge of the photodiode 22 at the time t17.

At time t23, the vertical scanning circuit 12 supplies the signal PTX1 (3) and the signal PTX2 (3) of the L level. As a result, the node 36 becomes the voltage which is based on the electric charge obtained by mutually adding the electric charges generated respectively by the photodiode 22 and the photodiode 26.

The amplifying transistor 32 outputs the signal, which is based on the electric potential of the node 36, via the selection transistor 34. This signal also includes the component of the N signal of the effective pixel 20. This signal is described as A+B+N signal. The A+B+N signal output from the effective pixel 20 is a second signal which is based on the electric charge obtained by mutually adding the electric charges generated respectively by the plurality of photoelectric converting units. On the other hand, The A+B+N signal output from the light-shielded pixel 25 is a third signal which is based on the electric charge obtained by mutually adding the electric charges generated respectively by the plurality of photoelectric converting units.

The A+B+N signal output to the vertical signal line 38 is input to the inverting input terminal of the operational amplifier 44 via the capacitive element C0 clamping the N signal. The signal input to the inverting input terminal of the operational amplifier 44 is the A+B signal obtained by subtracting the N signal from the A+B+N signal.

The operational amplifier 44 outputs an amplified signal of the A+B signal. The signal output from the operational amplifier 44 includes the component of the offset signal. This signal is described as an amplified A+B+Off signal.

The signal output from the operational amplifier 44 is input to the comparison circuit 46 via the capacitive element C3 clamping the Off signal. The signal input to the comparison circuit 46 is an amplified A+B signal obtained by subtracting the Off signal from the amplified A+B+Off signal.

The amplified A+B signal is subjected to AD conversion by the operations of the comparison circuit 46, the counter circuit 48, and the memory unit 50 from time t24 to time t27. The digital signal obtained by subjecting the amplified A+B signal to the AD conversion is described as a digital A+B+N signal.

Then, the horizontal scanning circuit 13 causes the memories of the columns corresponding to the light-shielded pixels 25 of the vertical light-shielded region 103-2, the light-shielded pixels 25 of the horizontal light-shielded region 103-1, and the effective pixels 20 shown in FIG. 2 to sequentially output the digital N signals and the digital A+N signals to the digital-signal processing circuit 16.

As a result, reading of the digital N signals and the digital A+N signals and reading of the digital N signals and the digital A+B+N signals are carried out from the column circuits 40 corresponding to the effective pixels 20 of the focal-point detection region 102 shown in FIG. 2. Reading of the digital N signals and the digital A+B+N signals is carried out from the column circuits 40 corresponding to the effective pixels 20 which are not included in the focal-point detection region 102.

Meanwhile, from the column circuits 40 corresponding to the light-shielded pixels 25 of the vertical light-shielded region 103-2 shown in FIG. 2, reading of the digital N signals and the digital A+N signals and reading of the digital N signals and the digital A+B+N signals are carried out. From the column circuits 40 corresponding to the light-shielded pixels 25 of the horizontal light-shielded region 103-1, reading of the digital N signals and the digital A+B+N signals is carried out.

Then, processing of the digital-signal processing circuit 16 will be described. The digital A signals, the digital A+B+N signals, and the digital N signals corresponding to the pixel signals of the light-shielded pixels 25 of the vertical light-shielded region 103-2 are input to the digital-signal processing circuit 16. Also, the digital A+B+N signals, the digital N signals corresponding to the pixel signals of the light-shielded pixels 25 of the horizontal light-shielded region 103-1 are input to the digital-signal processing circuit 16.

Also, the digital A+N signals, the digital A+B+N signals, and the digital N signals corresponding to the pixel signals of the effective pixels 20 included in the focal-point detection region 102 are input to the digital-signal processing circuit 16. Also, the digital A+B+N signals and the digital N signals corresponding to the pixel signals of the effective pixels 20 which are not included in the focal-point detection region 102 are input to the digital-signal processing circuit 16.

The digital-signal processing circuit 16 obtains the digital A signal which is the signal of the difference between the digital A+N signal and the digital N signal corresponding to the pixel signal of the light-shielded pixel 25 of the vertical light-shielded region 103-2. The digital A signal corresponding to the pixel signal of the light-shielded pixel 25 of the vertical light-shielded region 103-2 is described as a DA (VOB) signal. Also, the digital-signal processing circuit 16 obtains the digital A+B signal which is the signal of the difference between the digital A+B+N signal and the digital N signal corresponding to the pixel signals of the light-shielded pixel 25 of the vertical light-shielded region 103-2. The digital A+B signal corresponding to the pixel signal of the light-shielded pixel 25 of the vertical light-shielded region 103-2 is described as a DAB (VOB) signal. The DAB (VOB) signal is a signal based on the A+B+N signal of the light-shielded pixel 25, which is the third signal.

The digital-signal processing circuit 16 retains the DAB (VOB) signal in an unshown memory.

Also, the digital-signal processing circuit 16 obtains the digital A+B signal which is the signal of the difference between the digital A+B+N signal and the digital N signal corresponding to the pixel signal of the light-shielded pixel 25 of the horizontal light-shielded region 103-1. The digital A+B signal corresponding to the pixel signal of the light-shielded pixel 25 of the horizontal light-shielded region 103-1 is described as a DAB (HOB) signal.

Also, the digital-signal processing circuit 16 obtains the digital A signal which is the signal of the difference between the digital A+N signal and the digital N signal corresponding to the pixel signals of the effective pixel 20 which is included in the focal-point detection region 102.

Also, the digital-signal processing circuit 16 obtains the digital A+B signals which are the signals of the differences between the digital A+B+N signal and the digital N signal corresponding to the pixel signals of the effective pixel 20 included in the focal-point detection region 102 and the effective pixel 20 not included in the focal-point detection region 102. The digital A signal corresponding to the pixel signal of the effective pixel 20 is described as a DA (EF) signal. Also, the digital A+B signal corresponding to the pixel signal of the effective pixel 20 is described as a DAB (EF) signal. The DA (EF) signal is a signal based on the A+N signal of the effective pixel 20, which is the first signal. The DAB (EF) signal is a signal based on the A+B+N signal of the effective pixel 20, which is the second signal.

The digital-signal processing circuit 16 carries out a first process of obtaining the signal of the difference (first difference) between the DA (EF) signal and the DAB (VOB) signal corresponding to the A+B signal of the light-shielded pixel 25 of the vertical light-shielded region 103-2 retained by the unshown memory.

Also, the digital-signal processing circuit 16 carries out a second process of obtaining the signal of the difference (second difference) between the DAB (EF) signal and the DAB (VOB) signal by using the DAB (VOB) signal used in the first process. In the first process and the second process, the single DAB (VOB) signal is commonly used for a plurality of DA (EF) signals and a plurality of DAB (EF) signals respectively corresponding to the plurality of effective pixels 20.

The digital-signal processing circuit 16 of the present embodiment carries out a process of obtaining the difference between the digital signal corresponding to the electric charge generated by the photoelectric converting unit(s) of only part of the effective pixels 20 and the digital signal corresponding to the electric charge obtained by mutually adding the electric charges generated by the plurality of photoelectric converting units of the light-shielded pixels 25. Also, the digital-signal processing circuit 16 carries out a process of obtaining the difference between the digital signal corresponding to the electric charge obtained by mutually adding the electric charges generated by the plurality of photoelectric converting units of the effective pixels 20 and the digital signal corresponding to the electric charge obtained by mutually adding the electric charges generated by the plurality of photoelectric converting units of the light-shielded pixels 25.

It is assumed that there is a case in which the digital-signal processing circuit 16 carries out a process of obtaining the difference between the DA (EF) signal and the DA (VOB) signal corresponding to the A signal of the light-shielded pixel 25 of the vertical light-shielded region 103-2. In this case, the digital-signal processing circuit 16 has to be further provided with a memory which retains the DA (VOB) signal retaining the DAB (VOB) signal. Therefore, the circuit area of the digital-signal processing circuit 16 is increased.

In the present embodiment, the DAB (VOB) signal is used in common in the first process and the second process. As a result, the digital-signal processing circuit 16 can be configured to be not provided with the memory which retains the DA (VOB) signal.

The image pickup apparatus of the present embodiment is capable of reducing the circuit area of the circuit which obtains the difference between the signal based on the pixel signal of the effective pixel 20 and the signal based on the pixel signal of the light-shielded pixel 25 and, at the same time, is capable of obtaining the difference accurately.

The DAB (VOB) signal described in the present embodiment may be an average signal of the digital A+B signals of the plurality of light-shielded pixels 25 of the vertical light-shielded region 103-2.

In the present embodiment, each of the column circuits 40 is configured to have the counter circuit 48. As another example, a single counter circuit may supply a common count signal to the column circuits 40 of a plurality of columns. In this case, the signal LAT is configured to be input to each of the memory units 50 of the column circuits 40 of the plurality of columns. The memory unit 50 is only required to retain the count signal output from the counter circuit at the timing at which the signal LAT is changed.

In the present embodiment, the example in which the signal VRAMP, which is a ramp signal, changes the electric potential like slopes has been described. As another example, the signal VRAMP may change the electric potential in a zigzag shape. The ramp-signal supplying circuit 15, which generates the signal VRAMP of the zigzag shape like this, may be provided with a digital/analog converter (DAC).

Each of the effective pixels 20 and the light-shielded pixels 25 is not required to have the selection transistor 34. Instead of providing the effective pixels 20 and the light-shielded pixels 25 with the selection transistors 34, selection and non-selection of the pixel may be switched by the electric potential of the node 36. For example, the power source voltage supplied to the reset transistor 30 can select a voltage for non-selection of the pixel and the voltage for selection of the pixel. For the pixel from which a pixel signal is to be read, the power source voltage is caused to be the voltage for selection. Then, the reset transistor 30 is turned on, and the electric potential of the node 36 is caused to be the electric potential for selection which turns on the amplifying transistor 32. On the other hand, for the pixel from which a pixel signal is not to be read, the power source voltage is caused to be the voltage for non-selection. Then, the reset transistor 30 is turned on, and the electric potential of the node 36 is caused to be the electric potential for non-selection which turns off the amplifying transistor 32. As a result, even in a case in which the pixel does not have the selection transistor 34, selection and non-selection of the pixel can be carried out. Even in the pixels having such a configuration, the operations of the present embodiment can be applied.

In the present embodiment, the A+N signal is read also from the light-shielded pixel 25 of the vertical light-shielded region 103-2. However, this reading may be configured to be not carried out. In this case, the image pickup apparatus can be further speeded up by the amount of the reading of the A+N signal not carried out with respect to the operations described in the present embodiment.

Second Embodiment

The present embodiment will be described mainly about the points different from the first embodiment.

In the image pickup apparatus of the first embodiment, the digital-signal processing circuit 16 uses the common DAB (VOB) signal in the first process and the second process.

In the present embodiment, the digital signal which is used in the first process and corresponding to the pixel signal of the light-shielded pixel 25 of the vertical light-shielded region 103-2 is a signal obtained by computing the DAB (VOB) signal used in the second process.

The configuration and operations of the image pickup apparatus of the present embodiment are the same as those described in the first embodiment. In the present embodiment, the digital signal which is used in the first process and corresponding to the pixel signal of the light-shielded pixel 25 of the vertical light-shielded region 103-2 is a signal obtained by multiplying the DAB (VOB) signal by ½. The photoelectric-converting-unit-derived noise component included in the DA (EF) signal corresponding to the electric charge of the only single photoelectric converting unit is about half of the photoelectric-converting-unit-derived noise component included in the DAB (EF) signal corresponding to the electric charges of the two photoelectric converting units. Therefore, the digital signal which is used in the first process and corresponding to the pixel signal of the light-shielded pixel 25 of the vertical light-shielded region 103-2 is configured to be the signal obtained by multiplying the DAB (VOB) signal by ½. As a result, the correlativity of the noise component mutually between the signals used in the first process can be increased, and the noise component of the DA (EF) signal can be suitably reduced.

In the present embodiment, the signal obtained by multiplying the DAB (VOB) signal by ½ is used in the first process. However, this multiplying factor can be appropriately changed. For example, it can be determined depending on the number of the photoelectric converting units corresponding to the signals which are respectively corresponding to the DA (EF) signal and the DAB (EF) signal. For example, there is an image pickup apparatus provided with four photoelectric converting units below one microlens. In this case, it is assumed that the DA (EF) signal corresponds to the electric charge of only the single photoelectric converting unit, and the DAB (EF) signal corresponds to the electric charges of the four photoelectric converting units. In this case, the signal used in the first process may be the signal obtained by multiplying the DAB (VOB) signal by ¼.

Also, as another example, in each of the plurality of light-shielded pixels 25 of the vertical light-shielded region 103-2, the ratio of the DA (VOB) signal and the DAB (VOB) signal is obtained. Then, an average ratio is obtained by using the ratios of the plurality of light-shielded pixels 25. The signal used in the first process may be generated by multiplying this average ratio by the DAB (VOB) signal.

In this manner, the image pickup apparatus of the present embodiment may use the signal, which is obtained by multiplying the DAB (VOB) signal used in the second process by the number smaller than 1, in the first process.

As a result, also in the present embodiment, the noise component can be suitably reduced from the signal corresponding to the pixel signal of the effective pixel 20.

Third Embodiment

An image pickup apparatus of the present embodiment will be described mainly about the points different from the first embodiment.

The configuration and operations of the image pickup apparatus of the present embodiment are the same as those of the first embodiment. The present embodiment is different from the first embodiment in a point that, after an offset is imparted to the DA (EF) signal used in the first process, the difference from the DAB (VOB) signal is obtained.

The photoelectric-converting-unit-derived noise component which is included in the DA (EF) signal corresponding to the electric charge of only the single photoelectric converting unit is smaller than the photoelectric-converting-unit-derived noise component which is included in the DAB (EF) signal corresponding to the electric charges of the two photoelectric converting units. Typically, the photoelectric-converting-unit-derived noise component which is included in the DA (EF) signal corresponding to the electric charge of only the single photoelectric converting unit is about ½ times the photoelectric-converting-unit-derived noise component which is included in the DAB (EF) signal corresponding to the electric charges of the two photoelectric converting units. Therefore, if the DAB (VOB) signal is subtracted from the DA (EF) signal, the noise component is excessively subtracted in some cases.

Therefore, in the present embodiment, the subtraction is carried out after an OFFSET signal, which is an offset, is imparted to the DA (EF) signal. This OFFSET signal is a digital signal of a predetermined value.

As a result, the image pickup apparatus of the present embodiment further has an effect of reducing a situation of excessively subtracting the noise component in addition to the effects provided by the image pickup apparatus of the first embodiment.

Fourth Embodiment

The present embodiment relates to an image pickup system having the image pickup apparatus of any of the above described embodiments.

Figure 5:
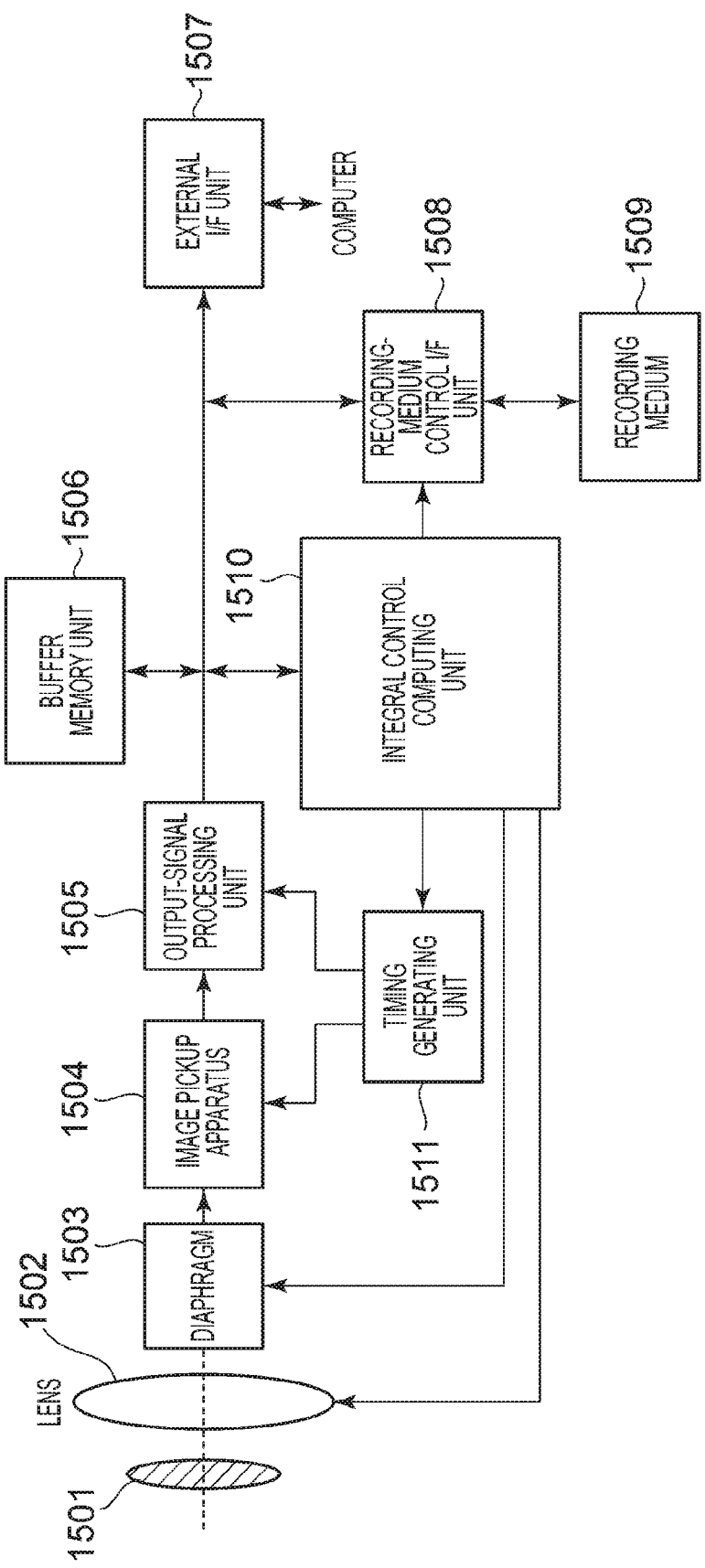
FIG. 5 is a diagram showing an example of a configuration of an image pickup system.

Examples of the image pickup system include a digital still camera, a digital camcorder, and a monitoring camera. FIG. 5 shows a schematic view of a case in which the image pickup apparatus is applied to a digital still camera as an example of the image pickup system.

The image pickup system exemplified in FIG. 5 has a barrier 1501 for lens protection, a lens 1502 which causes an optical image of an object to be formed at an image pickup apparatus 1504, and a diaphragm 1503 capable of changing the light quantity which passes through the lens 1502. The lens 1502 and the diaphragm 1503 are optical systems which condenses light at the image pickup apparatus 1504. The image pickup system exemplified in FIG. 5 has an output-signal processing unit 1505, which carries out processing of output signals output from the image pickup apparatus 1504. The output-signal processing unit 1505 carries out operations of carrying out various corrections and compressions in accordance with needs and outputting signals.

The image pickup system exemplified in FIG. 5 further has a buffer memory unit 1506 for temporarily storing image data and an external interface unit 1507 for communicating with an external computer, etc. Furthermore, the image pickup system has a detachable/attachable recording medium 1509 such as a semiconductor memory for recording or reading image data and has a recording-medium control interface unit 1508 for recording or reading the recording medium 1509. Furthermore, the image pickup system has an integral control computing unit 1510, which controls various computations and the whole digital still camera, and has a timing supplying unit 1511, which outputs various timing signals to the image pickup apparatus 1504 and the output-signal processing unit 1505. Herein, the timing signals, etc. may be input from outside, and the image pickup system is required to have at least the image pickup apparatus 1504 and the output-signal processing unit 1505, which processes the output signals output from the image pickup apparatus 1504.

The output-signal processing unit 1505 is provided on a second semiconductor substrate which is different from a first semiconductor substrate on which the image pickup apparatus 1504 is formed. The first semiconductor substrate and the second semiconductor substrate may be different chips or may be formed into a single chip by stacking.

The output-signal processing unit 1505 may be configured to carry out the first process and the second process, which are carried out by the digital-signal processing circuit 16 of the image pickup apparatus in the first to third embodiments, in place of the digital-signal processing circuit 16.

Also, the output-signal processing unit 1505 may be configured to carry out a focal-point detecting operation by using the first difference obtained in the first process and the second difference obtained in the second process. In this case, a third process of obtaining a third difference is carried out by subtracting the signal which has undergone the first process from the signal which has undergone the second process. As a result, in the single effective pixel 20, the signal corresponding to the electric charge of the photoelectric converting unit which is different from the photoelectric converting unit corresponding to the first difference is obtained. Focal-point detection can be carried out by using the third difference obtained by this third process and the first difference. The output-signal processing unit 1505 can generate an image from the second difference.

As described above, the image pickup system of the present embodiment can carry out focal-point detecting operations and image pickup operations by applying the image pickup apparatus 1504.

All of the above described embodiments merely show examples of substantiation for carrying out the disclosure, and the technical scope of the disclosure must not be interpreted in a limited manner thereby. In other words, the disclosure can be carried out in various forms without departing from the technical idea thereof or from main characteristics thereof. The embodiments described above can be carried out in various combinations.

According to the disclosure, the difference between the signal based on the pixel signal of the effective pixel and the signal based on the pixel signal of the light-shielded pixel can be suitably obtained.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-030333, filed Feb. 19, 2016, which is hereby incorporated by reference herein in its entirety.

What is claimed is:

1. An image pickup apparatus comprising:
a plurality of pixels arranged in a plurality of rows, that each has one microlens and a plurality of photoelectric converting units disposed to correspond to each one of the microlenses, and that outputs a signal by each row, wherein
a first row being a part of the plurality of rows includes an effective pixel having the plurality of photoelectric converting units to which the light transmitted through the one microlens enters,
a second row being other part of the plurality of rows includes a light-shielded pixel having the plurality of photoelectric converting units shielded from light, and does not include the effective pixel,
the effective pixel in the first row outputs a first signal based on a signal generated by the photoelectric converting unit being only a part of the plurality of photoelectric converting units and outputs a second signal based on a signal obtained by adding signals generated by the plurality of photoelectric converting units,
the light-shielded pixel in the second row outputs a third signal based on a signal obtained by adding signals generated by the plurality of photoelectric converting units, and
the image pickup apparatus further comprises a signal processing unit configured to obtain a first difference between a signal based on the first signal and a signal based on the third signal and obtain a second difference between a signal based on the second signal and the signal based on the third signal.

2. The image pickup apparatus according to claim 1, wherein the signals based on the third signal used to obtain the first difference and the second difference are the same signal.

3. The image pickup apparatus according to claim 2, wherein the first difference is obtained by the signal based on the first signal generated by adding a signal of a predetermined value to the first signal and the signal based on the third signal.

4. The image pickup apparatus according to claim 2, wherein the signal based on the third signal used to obtain the first difference and the second difference is a signal generated by multiplying the third signal by a number smaller than 1.

5. The image pickup apparatus according to claim 2, wherein
the first signal, the second signal, and the third signal are converted to a first digital signal, a second digital signal, and a third digital signal, respectively, and
the signal based on the first signal, the signal based on the second signal, and the signal based on the third signal are a signal based on the first digital signal, a signal based on the second digital signal, and a signal based on the third digital signal, respectively.

6. The image pickup apparatus according to claim 5, wherein the first difference is obtained by the signal based on the first digital signal generated by adding a digital signal of a predetermined value to the first digital signal and by the signal based on the third digital signal.

7. The image pickup apparatus according to claim 6, wherein the signal processing unit provided on a semiconductor substrate provided with the plurality of pixels obtains the first difference and the second difference.

8. The image pickup apparatus according to claim 5, wherein the signal based on the third digital signal which is the signal based on the third signal used to obtain the first difference and the second difference is a signal generated by multiplying the third digital signal by a number smaller than 1.

9. The image pickup apparatus according to claim 8, wherein the signal processing unit provided on a semiconductor substrate provided with the plurality of pixels obtains the first difference and the second difference.

10. The image pickup apparatus according to claim 5, wherein the signal processing unit provided on a semiconductor substrate provided with the plurality of pixels obtains the first difference and the second difference.

11. The image pickup apparatus according to claim 1, wherein the first difference is obtained by the signal based on the first signal generated by adding a signal of a predetermined value to the first signal and the signal based on the third signal.

12. The image pickup apparatus according to claim 1, wherein the signal based on the third signal used to obtain the first difference and the second difference is a signal generated by multiplying the third signal by a number smaller than 1.

13. The image pickup apparatus according to claim 1, wherein
the first signal, the second signal, and the third signal are converted to a first digital signal, a second digital signal, and a third digital signal, respectively, and
the signal based on the first signal, the signal based on the second signal, and the signal based on the third signal are a signal based on the first digital signal, a signal based on the second digital signal, and a signal based on the third digital signal, respectively.

14. The image pickup apparatus according to claim 13, wherein the first difference is obtained by the signal based on the first digital signal generated by adding a digital signal of a predetermined value to the first digital signal and by the signal based on the third digital signal.

15. The image pickup apparatus according to claim 13, wherein the signal based on the third digital signal which is the signal based on the third signal used to obtain the first difference and the second difference is a signal generated by multiplying the third digital signal by a number smaller than 1.

16. The image pickup apparatus according to claim 1, wherein the signal processing unit provided on a semiconductor substrate provided with the plurality of pixels obtains the first difference and the second difference.

17. An image pickup system comprising:
an image pickup apparatus; and
an output-signal processing unit configured to generate an image by using a signal output from the image pickup apparatus, the image pickup apparatus including:
a plurality of pixels arranged in a plurality of rows, that each has one microlens and a plurality of photoelectric converting units disposed to correspond to each one of the microlenses, and that outputs a signal by each row, wherein
a first row being a part of the plurality of rows includes an effective pixel having the plurality of photoelectric converting units to which the light transmitted through the one microlens enters,
a second row being other part of the plurality of rows includes a light-shielded pixel having the plurality of photoelectric converting units shielded from light, and does not include the effective pixel,
the effective pixel in the first row outputs a first signal based on a signal generated by the photoelectric converting unit being only a part of the plurality of photoelectric converting units and outputs a second signal based on a signal obtained by adding signals generated by the plurality of photoelectric converting units,
the light-shielded pixel in the second row outputs a third signal based on a signal obtained by adding signals generated by the plurality of photoelectric converting units, and
the image pickup apparatus further includes a signal processing unit configured to obtain a first difference between a signal based on the first signal and a signal based on the third signal and obtain a second difference between a signal based on the second signal and the signal based on the third signal.

18. The image pickup system according to claim 17, wherein the output-signal processing unit obtains a third difference which is a difference between the first difference and the second difference, carries out focal-point detection by using the first difference and the third difference, and generates the image by using the second difference.

19. An image pickup system comprising:
an image pickup apparatus including a plurality of pixels arranged in a plurality of rows, that each has one microlens and a plurality of photoelectric converting units disposed to correspond to each one of the microlenses, and that outputs a signal by each row; and a signal processing unit, wherein a first row being a part of the plurality of rows includes an effective pixel having the plurality of photoelectric converting units to which the light transmitted through the one microlens enters, a second row being other part of the plurality of rows includes a light-shielded pixel having the plurality of photoelectric converting units shielded from light, and does not include the effective pixel, the effective pixel in the first row outputs a first signal based on a signal generated by the photoelectric converting unit being only a part of the plurality of photoelectric converting units and outputs a second signal based on a signal obtained by adding signals generated by the plurality of photoelectric converting units, the light-shielded pixel in the second row outputs a third signal based on a signal obtained by adding signals generated by the plurality of photoelectric converting units, and the signal processing unit obtains a first difference between a signal based on the first signal and a signal based on the third signal and obtains a second difference between a signal based on the second signal and the signal based on the third signal.

20. The image pickup system according to claim 19, wherein the signal processing unit obtains a third difference which is a difference between the first difference and the second difference, carries out focal-point detection by using the first difference and the third difference, and generates the image by using the second difference.

* * * * *